US007649372B2

(12) United States Patent  (10) Patent No.: US 7,649,372 B2
Rogers et al.  (45) Date of Patent: Jan. 19, 2010

(54) DIE DESIGN WITH INTEGRATED ASSEMBLY AID

(75) Inventors: Robert L. Rogers, Sandy Hook, CT (US); Alexander Brandorff, New Milford, CT (US); William H. Fulton, Newtown, CT (US); Pasquale Nifo Sarrapochiello, Oakville, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

(21) Appl. No.: 12/027,711

(22) Filed: Feb. 7, 2008

(65) Prior Publication Data

US 2009/0096474 A1  Apr. 16, 2009

Related U.S. Application Data

(63) Continuation-in-part of application No. 11/872,433, filed on Oct. 15, 2007, now Pat. No. 7,388,392, which is a continuation of application No. 10/987,039, filed on Nov. 12, 2004, now Pat. No. 7,282,936.

(60) Provisional application No. 60/519,966, filed on Nov. 14, 2003.

(51) Int. Cl.
*G01R 31/02* (2006.01)
(52) U.S. Cl. .................... 324/761; 324/754; 324/758
(58) Field of Classification Search .................... None
See application file for complete search history.

(56) References Cited

U.S. PATENT DOCUMENTS

| 4,774,462 | A | | 9/1988 | Black |
| 4,901,013 | A | | 2/1990 | Benedetto et al. |
| 5,977,787 | A | * | 11/1999 | Das et al. ............ 324/761 |
| 6,507,207 | B2 | | 1/2003 | Nguyen |
| 6,515,496 | B2 | | 2/2003 | Felici et al. |
| 6,768,327 | B2 | | 7/2004 | Felici et al. |
| D507,198 | S | | 7/2005 | Kister |
| D510,043 | S | | 9/2005 | Kister |
| 7,180,318 | B1 | | 2/2007 | Mahoney et al. |
| 7,301,354 | B2 | | 11/2007 | Crippa et al. |
| 2005/0110510 | A1 | * | 5/2005 | Brandorff ............ 324/758 |
| 2007/0257689 | A1 | | 11/2007 | Dalton et al. |

* cited by examiner

*Primary Examiner*—Minh N Tang
(74) *Attorney, Agent, or Firm*—Wiggin and Dana LLP; Anthony P. Gangemi

(57) ABSTRACT

Methods and systems for inserting and replacing swaged probe pins in a lower die portion of a head having an array of micro-holes for receiving the probe pins are disclosed. The methods and systems include the following: swaged probe pins including substantially cylindrical ends and a swaged center portion; and an assembly aid film including an array of slotted holes, each of the slotted holes including a substantially round portion for receiving the substantially cylindrical ends of the swaged probe pins and slot portions for receiving the swaged center portion of the swaged probe pins. The array of slotted holes is configured to properly align the swaged probe pins with the array of micro-holes.

4 Claims, 7 Drawing Sheets

DIE DESIGN WITH INTEGRATED ASSEMBLY AID

CROSS REFERENCE TO RELATED APPLICATION

This application is a continuation-in-part of U.S. application Ser. No. 11/872,433 (now U.S. Pat. No. 7,388,392), filed Oct. 15, 2007, which is a continuation of U.S. application Ser. No. 10/987,039 filed on Nov. 12, 2004 (now U.S. Pat. No. 7,282,936, which claims the benefit of U.S. Provisional Application No. 60/519,966, filed Nov. 14, 2003, each of which is hereby incorporated by reference as if fully disclosed herein in its entirety.

BACKGROUND

U.S. Pat. Nos. 6,297,657, 6,633,175, and 7,282,936 illustrate vertical pin probing devices and are incorporated by reference as if fully disclosed in their entireties herein.

One type of vertical pin probing devices utilizes a buckling beam die design. As described in U.S. Pat. No. 6,297,657, an integrated circuit or other device under test is supported on a movable chuck. The integrated circuit typically has a pattern or matrix of contact pads to be simultaneously probed by a vertical-pin integrated circuit probing device, such as the probe head sold under the brand name COBRA® by Wentworth Laboratories of Brookfield, Conn. The probing device includes a lower die with a group of holes and an upper die with a group of holes separated by a spacer and carrying multiple vertical pin probes. The die materials are typically made of a plastic insulating material such as those sold under the brand name Delrin®, an acetal resin that is a registered trademark E.I. duPont de Nemours & Co of Wilmington, Del., a low expansion metal such as those sold under the brand name Invar®, a nickel alloy that is a registered trademark of Imphy, S.A., or a ceramic such as silicon nitride.

Each probe pin has a probe tip that protrudes from a hole in the lower face of the lower die and an exposed head that protrudes from holes in the upper side of upper die. Holes containing opposing ends of the vertical probe pins are slightly offset from one another and the probe pins are curved in a snake-like configuration to promote buckling, to create substantially uniform contact pressure on the integrated circuit pads despite any slight vertical unevenness or misalignment.

With reference to FIG. 1, a partially-assembled portion of a buckling beam die 10 as known in the prior art includes of a lower die 12, probe pins 14, and an assembly aid film 16. Lower die 12 contains an array of micro-holes 18 into which probe tips 20 are inserted. Assembly aid film 16 contains a matching pattern of micro-holes 22 punched into the film. One edge 24 of a small piece of assembly aid film 16 is adhered, e.g., using tape or similar, to top 26 of lower die 12 so that it is approximately positioned over micro-holes 18. Each probe tip 20 is inserted into one of lower die micro-hole 18, and then probe head 28 is inserted up through a corresponding micro-hole 22 in assembly aid film 16 to hold probe pin 14 in position. This process is continued until each of probe pins 14 are in place. Insertion of probe heads 28 requires lifting assembly aid film 16 to provide sufficient clearance to slip each probe head under the film and up through the proper one of micro-holes 18. As the assembly proceeds, it is necessary to tie down assembly aid film 16 periodically to prevent it from lifting up off probe heads 28 of the contacts that have already been installed. Regardless, assembly aid film 16 occasionally lifts off probe heads 28 resulting in the need for a partial or complete re-assembly. The process of fitting probe heads 28 up through micro-holes 22 in assembly aid film 16 also presents opportunities for each of probe pins 14 to be inadvertently bent.

After each of probe pins 14 have been loaded into lower die 12 and assembly aid film 16, it is necessary to cut the film so that it fits entirely inside an upper die cavity, and to remove the tie-down wires. This process often results in assembly aid film 16 lifting off one or more of probe heads 28, again requiring a partial or complete re-build of the assembly. After assembly aid film 16 has been cut and the wires removed, it is necessary to install an upper die 30. As shown in FIG. 2, this requires aligning upper die 30, which has an array of micro-holes 32 matching the pattern of micro-holes 18 and 22 in lower die 12 and assembly aid film 16, respectively, over array of probe pins 14 such that each of probe heads 28 lines up with a respective one of the micro-holes in the upper die. This is a delicate operation, as typically each of thousands of probe pins 14 must pass through one of micro-holes 32 simultaneously in order to avoid bending probe pins. Consequently, each of micro-holes 32 in upper die 30 are larger than those in lower die 12 and in assembly aid film 16 to facilitate assembly. Also, still referring to FIG. 2, upper die 30 is conventionally made by starting with a round disk of polyimide material of approximately 0.1 inch thickness, and milling out a cavity 34 leaving a thin "web" on the order of 0.010" thick through which the pattern defining array of micro-holes 32 is drilled. It is often difficult to keep such a thin web of material flat across the array due to unbalanced internal stresses in the material after milling, moisture absorption, etc., and may result in a relatively low yield rate for upper dies.

After upper die 30 is installed, alignment pins (not shown) are inserted to correctly align the upper die with lower die 12 dies, and screws (not shown) are installed to hold the upper and lower dies together. Probe heads 28 are then lapped in order to arrive at a consistent over-all probe pin length throughout the array. One consequence of the lapping process is that lapping debris passes through over-sized micro-holes 32 in upper die 30 and collects on assembly aid film 16 inside the head assembly. This debris is conductive and must be removed to avoid electrical shorting between contacts. It is therefore necessary to remove upper die 30 after lapping in order to adequately remove the debris. The removal of upper die 30 presents a further opportunity for assembly aid film 16 to lift off probe heads 28, requiring a partial or full re-build of the assembly. It also requires upper die 30 alignment and assembly to be repeated, presenting another opportunity for bending probe pins 14 if alignment is not perfect.

One of the advantages of buckling beam technology is repair-ability. Since the probe pins are not permanently bonded to the test electronics, it is possible to replace damaged probe pins rather than discard the entire assembly. The repair process with the conventional design as illustrated in FIG. 2 may be problematic. The repair process requires removal of upper die 30 to gain access to probe pins 14. A damaged one of probe pins 14 is then extracted by pulling it through assembly aid film 16, and re-inserting a new probe pin through the same assembly aid film hole. There are several problems that may arise when using this technique. First, the removal of upper die 30 may cause assembly aid film 16 to lift off one or more of probe heads. Static electricity sometimes results in assembly aid film 16 adhering to the underside of upper die 30 and coming completely off the array, resulting in the need for a complete re-build.

Assuming upper die 30 is successfully removed, any of probe pins 14 that are damaged must then be withdrawn through assembly aid film 16. Since micro-holes 22 in assembly aid film 16 are "tight", e.g., with a diameter on the order of 0.0001 inch larger than the diameter of typical probe pin 14, the assembly aid film must be slightly torn in order for the probe pin "swage" to pass through the film. This "tugging" on assembly aid film 16 presents another opportunity for the film to lift off of one or more of probe pins 14.

Assuming a damaged one of probe pins 14 is successfully removed and another probe pin inserted, the particular one of micro-holes 22 in assembly aid film 16 is now enlarged, causing potential difficulties in aligning the new probe pin with its associate micro-hole 32 in upper die 30. Also, enlarged one of micro-holes 22 in assembly aid film 16 allows probe pin 14 more freedom of movement, which may allow it to contact a neighboring probe pin in tight tolerance applications resulting in an electrical short circuit.

SUMMARY

A system for inserting and replacing swaged probe pins in a lower die portion of a head having an array of micro-holes for receiving the probe pins is disclosed. In some embodiments, the system includes the following: swaged probe pins including substantially cylindrical ends and a swaged center portion; and an assembly aid film including an array of slotted holes, each of the slotted holes including a substantially round portion for receiving the substantially cylindrical ends of the swaged probe pins and slot portions for receiving the swaged center portion of the swaged probe pins; wherein the array of slotted holes is configured to properly align the swaged probe pins with the array of micro-holes.

An upper die portion of a die head for aligning swaged probe pins in an array of micro-holes formed in a lower die portion of the die head is disclosed. In some embodiments, the upper die portion includes the following: a spacer portion including first and second surfaces, the first surface adapted to contact the lower die portion; a first support frame positioned above the second surface; an assembly aid film having an array of slotted holes adapted to receive the swaged probe pins; a second support frame positioned above the first support frame and the assembly aid film; and a sheet joined with the second support frame and having an array of micro-holes adapted to receive the swaged probe pins.

An upper die portion of a die head for aligning swaged probe pins in an array of micro-holes formed in a lower die portion of the die head is disclosed. In some embodiments, the upper die portion includes the following: a spacer portion including first and second surfaces, the first surface adapted to contact the lower die portion; a support frame; and an assembly aid film attached with the second surface of the spacer portion and having an array of slotted holes adapted to receive the swaged probe pins.

A die head including alignment mechanisms for aligning probe pins having substantially cylindrical ends and a swaged center portion in the die head is disclosed. In some embodiments, the die head includes the following: a lower die portion having multiple surfaces, at least one of the multiple surfaces having an array of micro-holes adapted to receive the cylindrical ends of the probe pins; and an upper die portion having a spacer portion and an assembly aid film, the spacer portion including first and second surfaces, the first surface in contact with at least one of the multiple surfaces of the lower die portion, the assembly aid film positioned adjacent with the second surface, the assembly aid film having an array of slotted holes adapted to receive both the cylindrical ends and the swaged center portion of one of the probe pins.

A method of aligning swaged probe pins in an array of micro-holes formed in a lower die portion of a die head assembly is disclosed. In some embodiments, the method includes the following: stacking an assembly aid sheet having slotted holes in a first position on top of the lower die portion so that round portions of the slotted holes are axially aligned with the array of micro-holes; inserting swaged probe pins having cylindrical end portions and a swaged center portion through the slotted holes in the assembly aid film and the array of micro-holes in the lower die portion; and lifting the assembly aid film to a second position by lifting it upwardly over the cylindrical end portion closest to the lower die portion and over the swaged center portion of each of the swaged probe pins; and wherein in the second position, each of the slotted holes are offset from each of array of micro-holes of lower die portion.

BRIEF DESCRIPTION OF THE DRAWINGS

For the purpose of illustrating the invention, the drawings show a form of the invention that is presently preferred. However, it should be understood that the disclosed subject matter is not limited to the precise arrangements and instrumentalities shown in the drawings, wherein.

DETAILED DESCRIPTION

Figure 1:
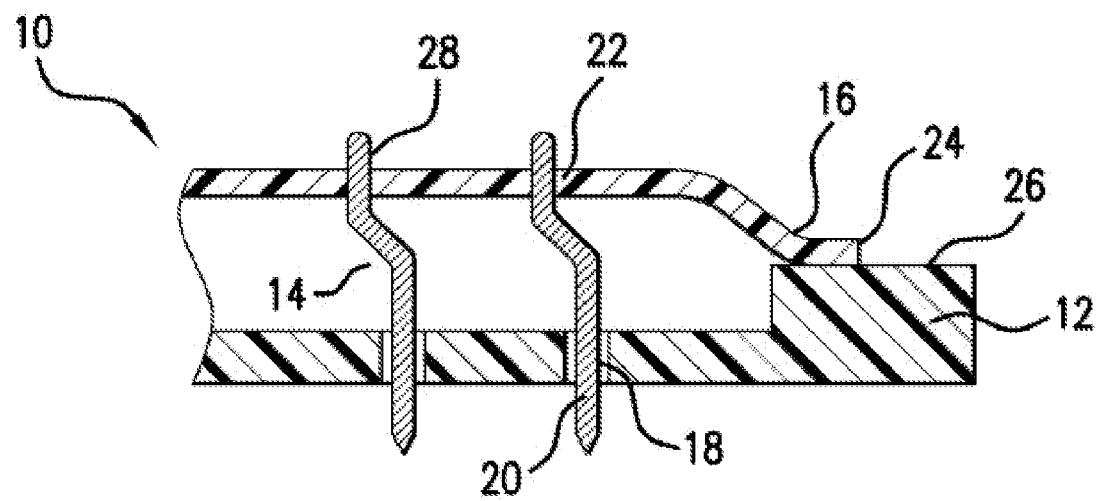
FIG. 1 is a cross-section of a partially-assembled buckling beam die known in the prior art.
Figure 2:
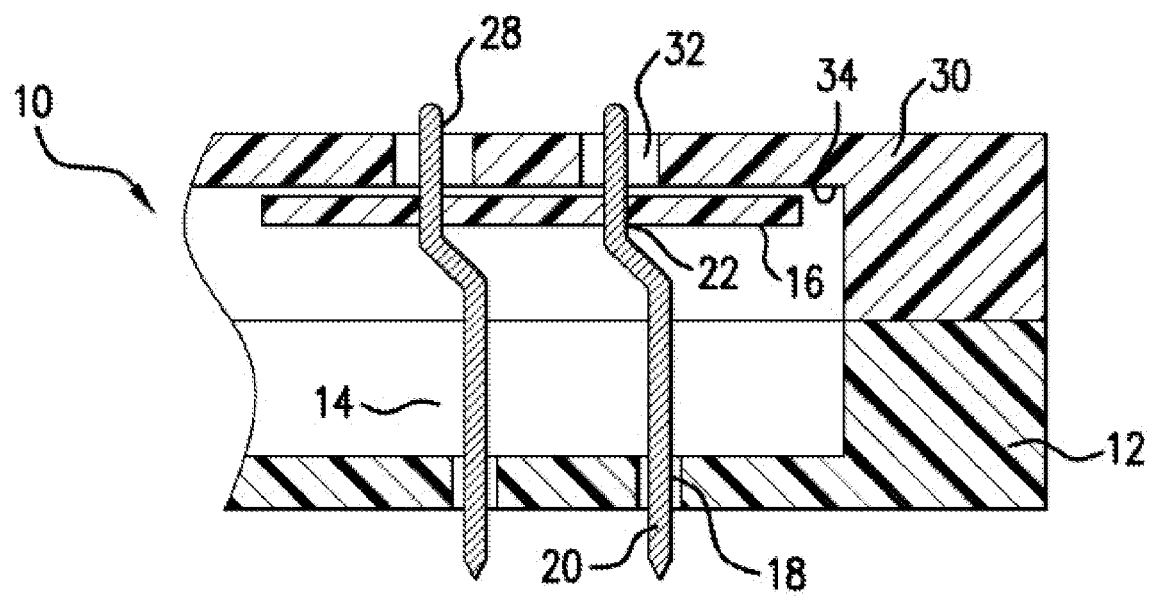
FIG. 2 is a cross-section of a fully-assembled buckling beam die known in the prior art.
Figure 3:
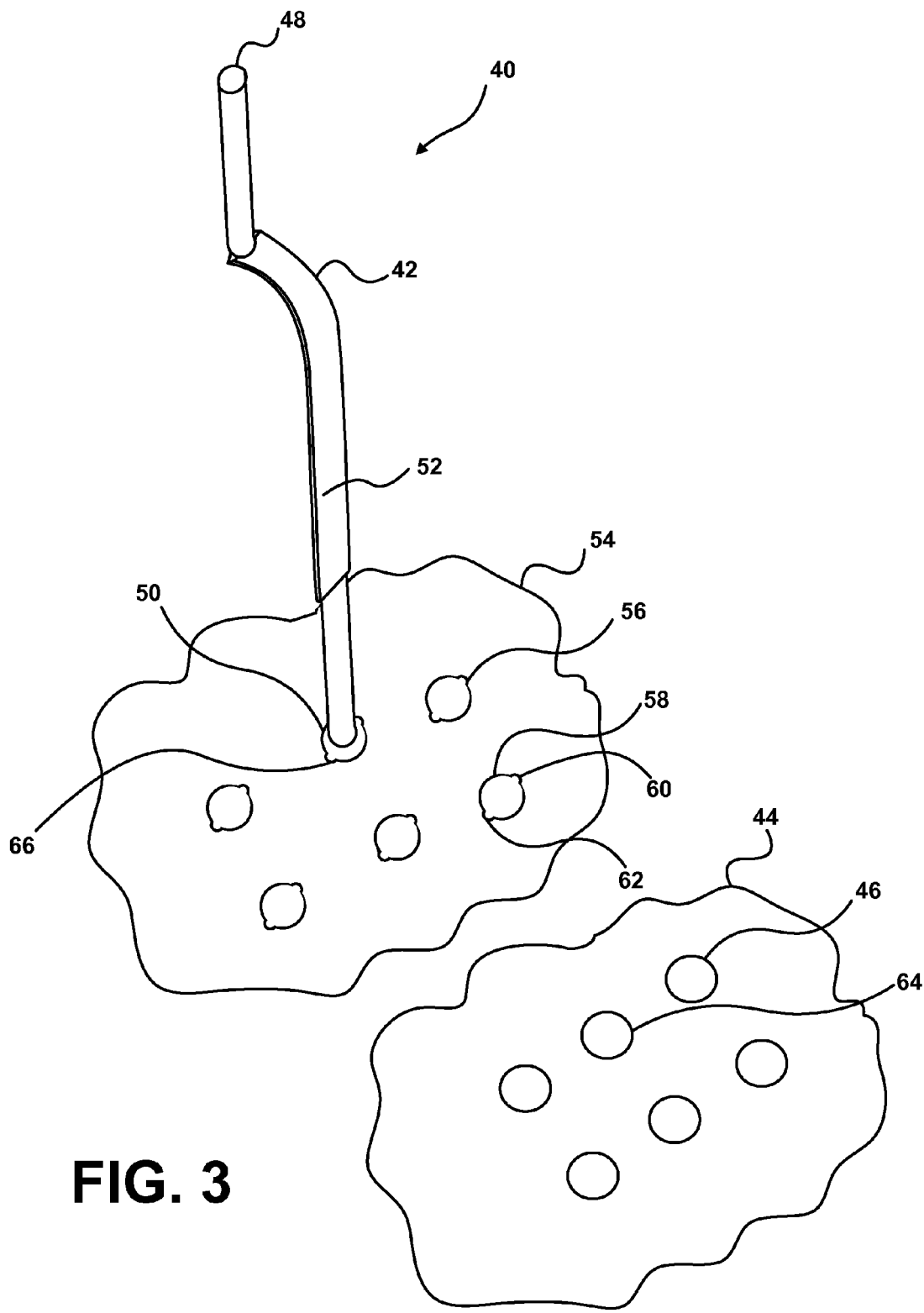
FIG. 3 is a partial isometric view of a system according to some embodiments of the disclosed subject matter.
Figures 4A, 4B, 4C:
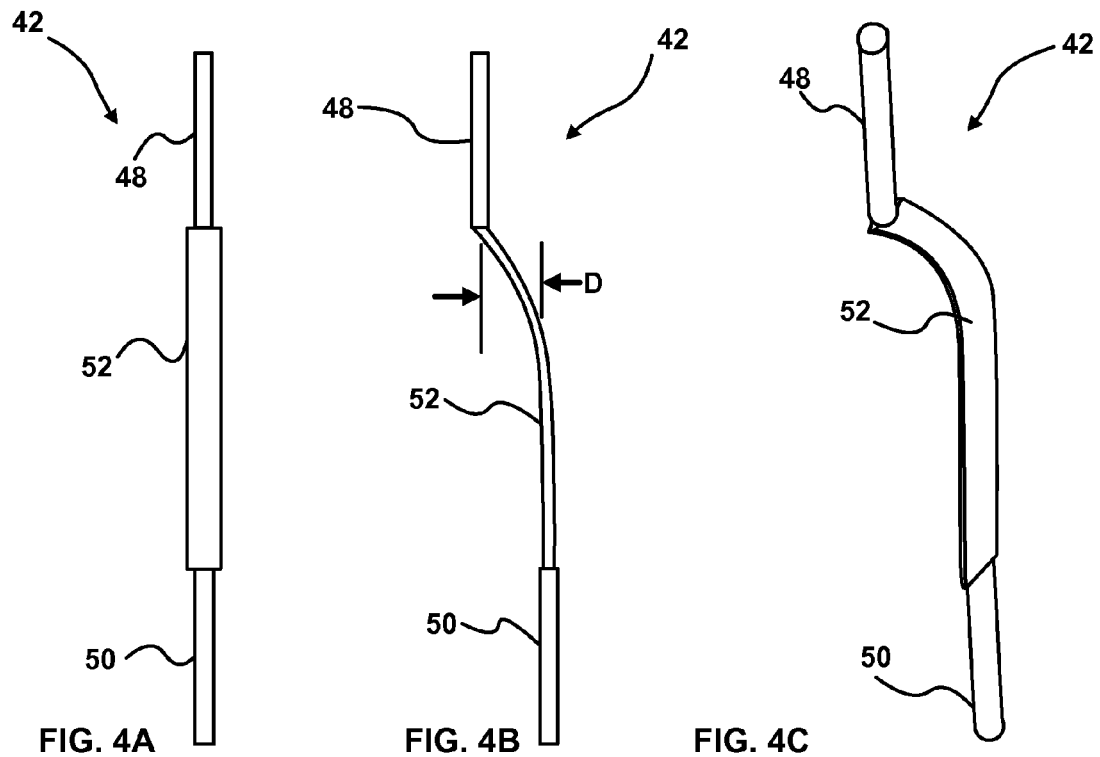
FIGS. 4A-4C are views of a swaged probe according to some embodiments of the disclosed subject matter.
Figure 5:
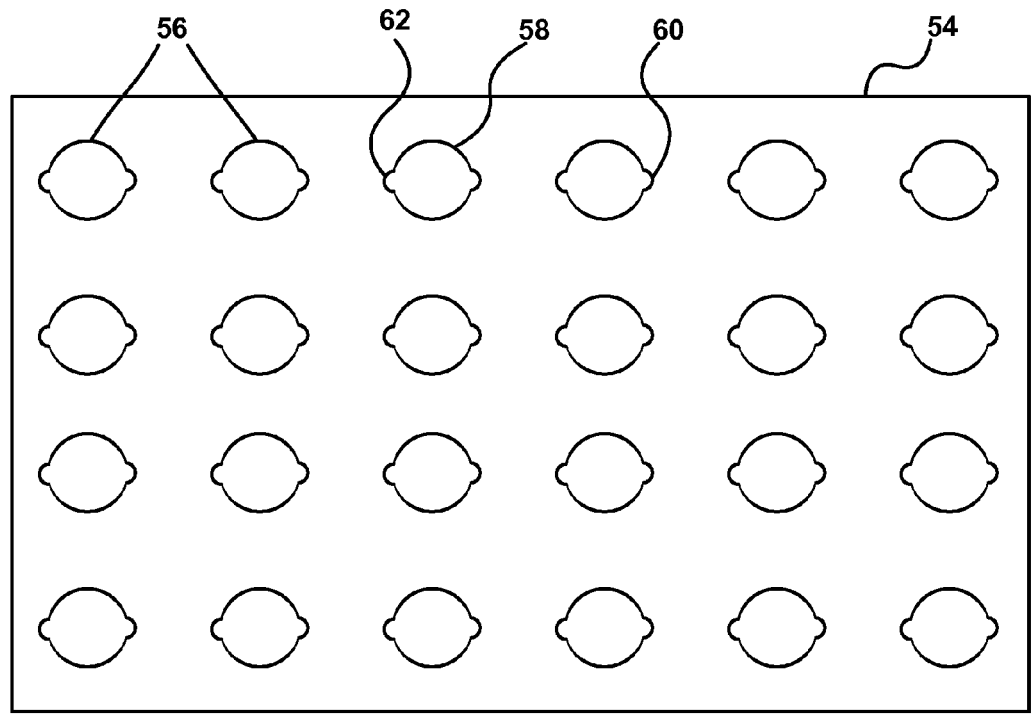
FIG. 5 is an enlarged plan view of slotted holes in a portion of an assembly aid film according to some embodiments of the disclosed subject matter.

Referring now to FIGS. 3-5, some embodiments of the disclosed subject matter include a system 40 for inserting and replacing swaged probe pins 42 in a die head having a lower die portion 44 with an array of micro-holes 46 for receiving the swaged probe pins. System 40 includes swaged probe pins 42. Each of swaged probe pins 42 typically, but not always, includes substantially cylindrical ends 48, 50 and a swaged center portion 52. As best shown in FIGS. 4B and 4C, ends 48 and 50 of each of swaged probe pins 42 are typically laterally offset from one another by a distance D to promote buckling of the pins so that they are spring-like. System 40 includes an assembly aid film 54 that has an array of slotted holes 56. Array of slotted holes 56 is configured to properly align swaged probe pins 42 with array of micro-holes 46. To account for the offset between ends 48 and 50 of swaged probe pins 42, array of slotted holes 56 is typically offset from array of micro-holes 46. Assembly aid film 54 is typically, but not always, at least semi-transparent. Each slotted hole of array of slotted holes 56 includes a substantially round portion 58 for receiving substantially cylindrical ends 48, 50 of swaged probe pins 42 and slot portions 60, 62 for receiving swaged center portion 52 of the swaged probe pins. Array of slotted holes 56 is typically, but not always, configured so that a first one 48 of the substantially cylindrical ends of each of swaged probe pins 42 is releasably retained within a micro-hole 64 of array of micro-holes 46 and a second one 50 of the substantially cylindrical ends of each of the swaged probe pins is releasably retained within substantially round portion 58 of a slotted hole 66 of the array of slotted holes.

As defined herein, the swaged probe pins can include a center portion that has a non-rectangular cross-section such as a D-shaped cross-section or star-shaped cross-section. As follows, the slotted holes of the assembly aid film are defined to include holes that allow the entire probe pin to pass through, regardless of their shape. For example, the disclosed subject matter contemplates the use of any cross-sectional shape for the center portion of the probe pin providing the slotted holes of the assembly aid film are fabricated and sized to allow the passage of the center portion and both cylindrical end portions of the probe pin without damaging the assembly aid film.

Figure 6:
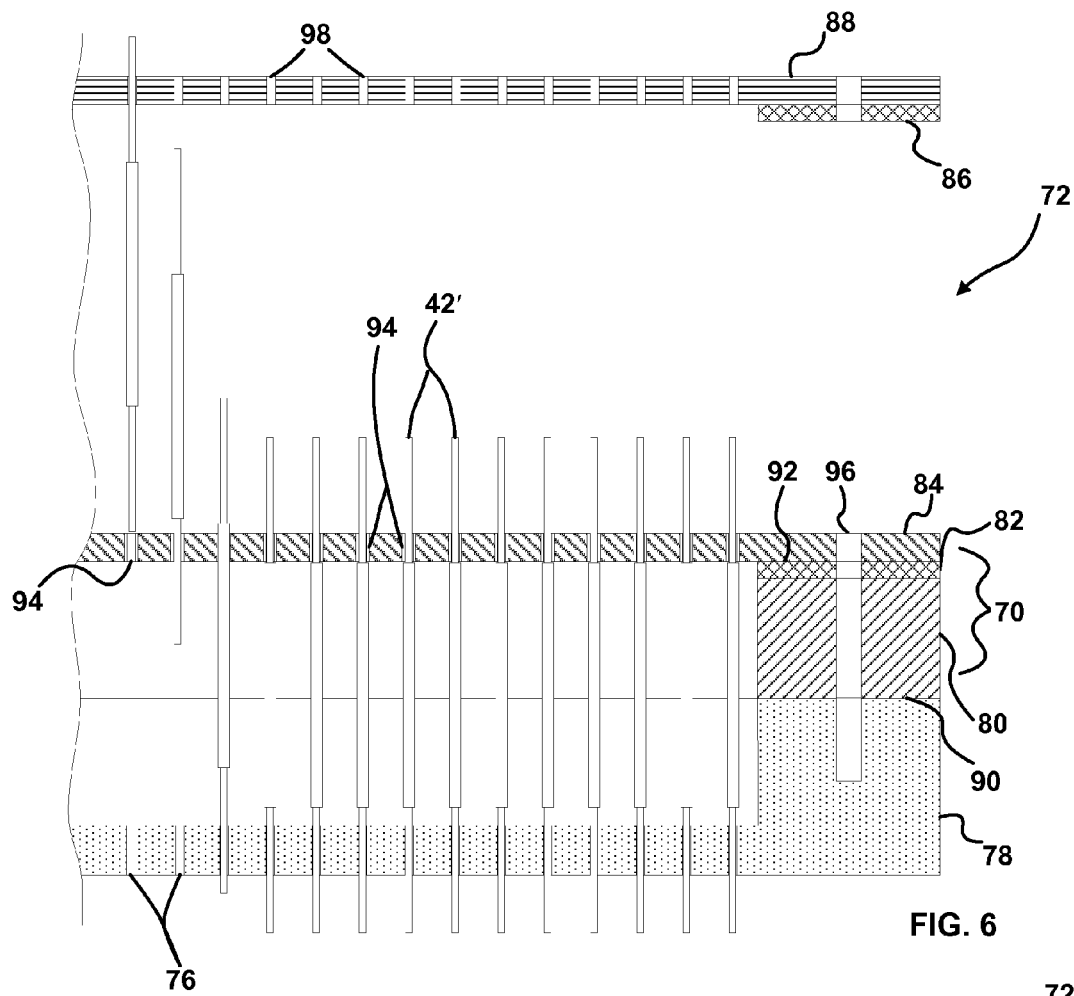
FIG. 6 is a cross-section of a die head according to some embodiments of the disclosed subject matter.
Figure 7:
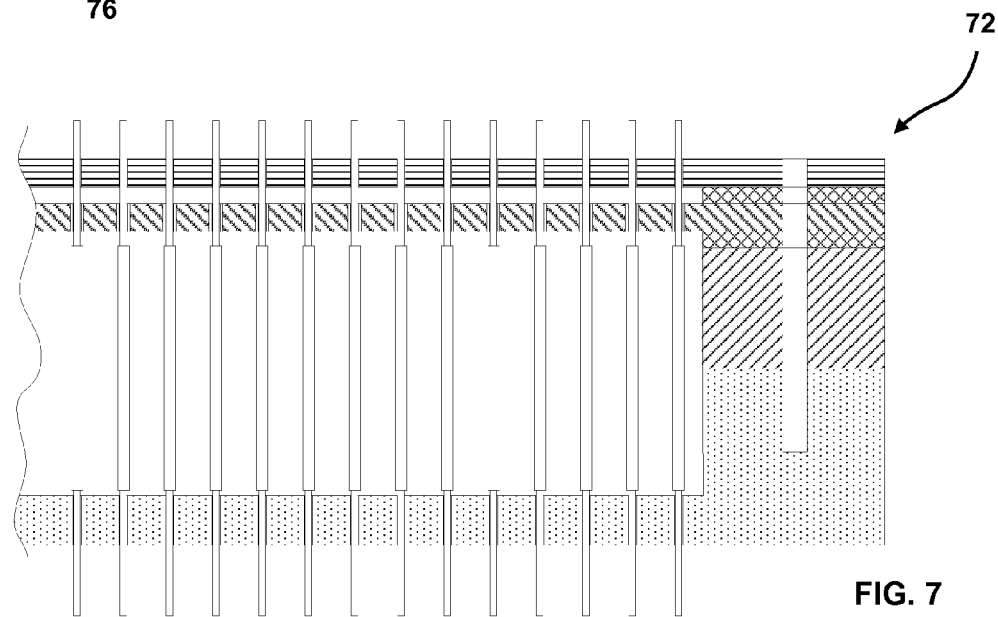
FIG. 7 is a cross-section of a die head according to some embodiments of the disclosed subject matter.
Figure 8:
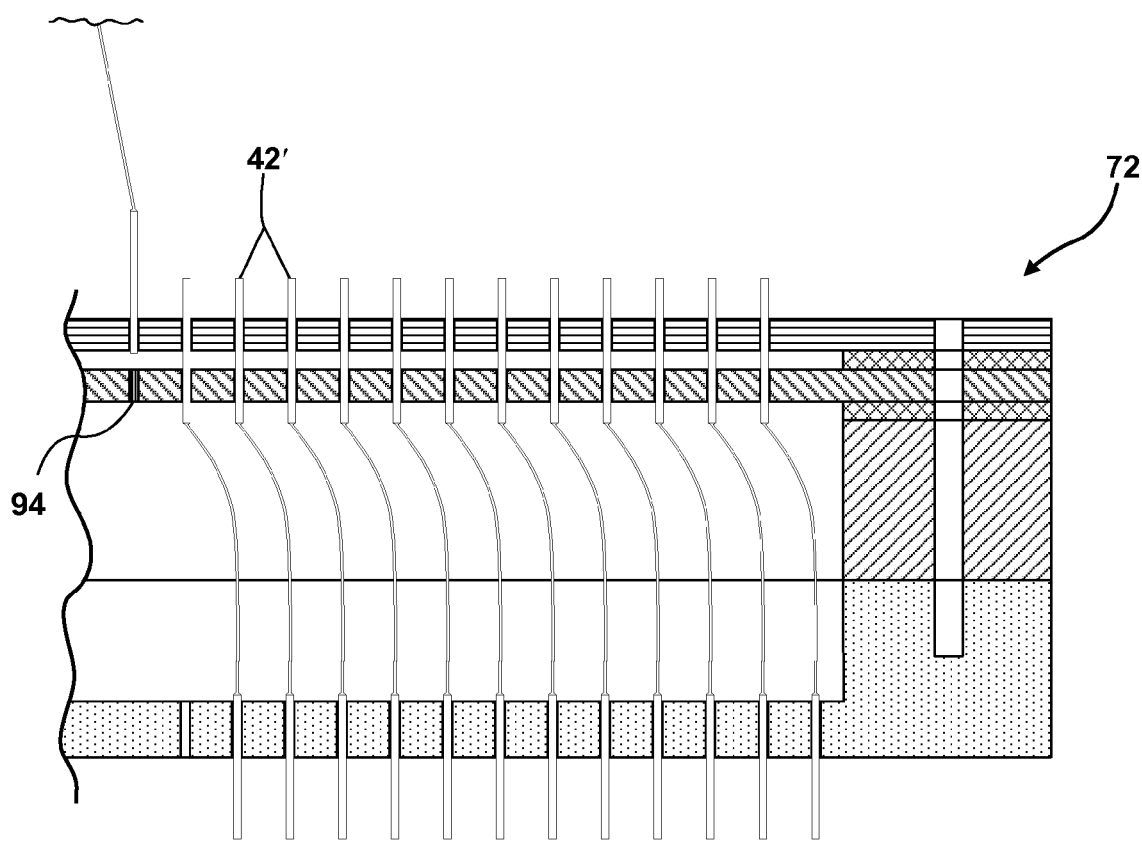
FIG. 8 is a cross-section of a die head according to some embodiments of the disclosed subject matter.

Referring now to FIGS. 6-8, some embodiments include an upper die portion 70 of a die head 72 for aligning swaged probe pins 42' in an array of micro-holes 76 formed in a lower die portion 78 of the die head. FIGS. 6 and 7 show a side section view from the front of swaged probe pins 42' and FIG. 8 shows a side section view from the side of the swaged probe pins. Upper die portion 70 generally includes a spacer portion 80, a first support frame 82, an assembly aid film 84, a second support frame 86, and a sheet 88.

Spacer portion 80 includes first and second surfaces 90 and 92, respectively. First surface 90 is adapted to contact lower die portion 78. Spacer portion 80 is typically an annular configuration having a square or rectangular cross-section and may be formed from any materials known to be suitable as a die portion, e.g., a fiber-filled epoxy, a low expansion metal, or a ceramic. Spacer portion 80 can have varying thicknesses in varying embodiments.

First support frame 82 is positioned above second surface 92 of spacer portion 80 and typically holds assembly aid film 84 taut. First support frame 82 is typically formed from a metal foil such as a low expansion nickel alloy for higher temperature applications, e.g., sold under the brand name Invar® or similar, or stainless steel for lower temperature applications, e.g., near room temperature. First support frame 82 is typically similar in shape to spacer portion 80 but with a smaller dimension with respect to the longitude of each of swaged probe pins 42'. Some embodiments of the disclosed subject matter may not include a support frame.

Assembly aid film 84 is typically positioned between first support frame 82 and second support frame 86 and includes an array of slotted holes 94 adapted to receive swaged probe pins 42'. Each of the round portions 58' in array of slotted holes 94 of assembly aid film 84 can be over-sized, e.g., typically having a diameter approximately 0.5 mil (0.0005 inch) larger than the diameter of ends 48' and 50' of swaged probe pins 42', which is smaller than micro-holes 22 in upper die 16 of the prior art. Each of the micro-holes in array of micro-holes 102 of second assembly aid film 100 are generally smaller than round portions 58' in array of slotted holes 94 of assembly aid film 84, e.g., typically having a diameter about 0.1 mil (0.0001 inch) larger than the diameter of each of ends 48' and 50' of swaged probe pins 42' so that the probe pins can be held in close relative alignment to each other and that each of the micro-holes is effectively sealed to prevent debris from entering the die head. Slot portions 60' of swaged probe pins 42' are sized so that a swaged center portion 52' of swaged probe pins 42' can pass through without tearing assembly aid film 84. Assembly aid film 84 is generally at least semi-transparent. Assembly aid film 84 may also include alignment holes 96, which are intended to engage a dowel or similar structure (not shown) for aligning the components of upper die portion 70 with lower die portion 78. Additional structural rigidity may be provided to upper die portion 70 by bonding assembly aid film 84 to support frame 86 and spacer portion 80 using commercially available adhesives, e.g., 3M 2290 Structural Adhesive (3M, St. Paul, Minn.) or similar.

As mentioned above, spacer portion 80 can have varying thicknesses in varying embodiments. The thickness of spacer portion 80 will generally determine what portion of each of swaged probe pins 42' is surrounded by each of array of slotted holes 94 when the die head is assembled. For example, in some embodiments, a thickness of spacer portion 80 is selected so each of array of slotted holes 94 of assembly aid film 84 surround one of ends 48' of swaged probe pins 42'. In some embodiments, a thickness of spacer portion 80 is selected so each of array of slotted holes 94 of assembly aid film 84 surround one of swaged center portion 52' of swaged probe pins 42'.

Second support frame 86 is positioned above first support frame 82 and assembly aid film 84. Sheet 88 is typically joined with second support frame 86 and includes an array of micro-holes 98 adapted to receive swaged probe pins 42'. Sheet 88 is typically formed from a polyimide having a thickness of about 4-12 mils. In some embodiments, sheet 88 has a thickness of about 6 mils. Array of slotted holes 94 and array of micro-holes 98 are typically aligned with one another and adapted to be offset from array of micro-holes 76 formed in lower die portion 78 of the die head.

Additional embodiments include variations to those illustrated in FIGS. 6-8. For example, referring now to FIG. 9, some embodiments are substantially the same as those illustrated in FIGS. 6-8, but do not include second support frame 86 and sheet 88.

Figure 9:
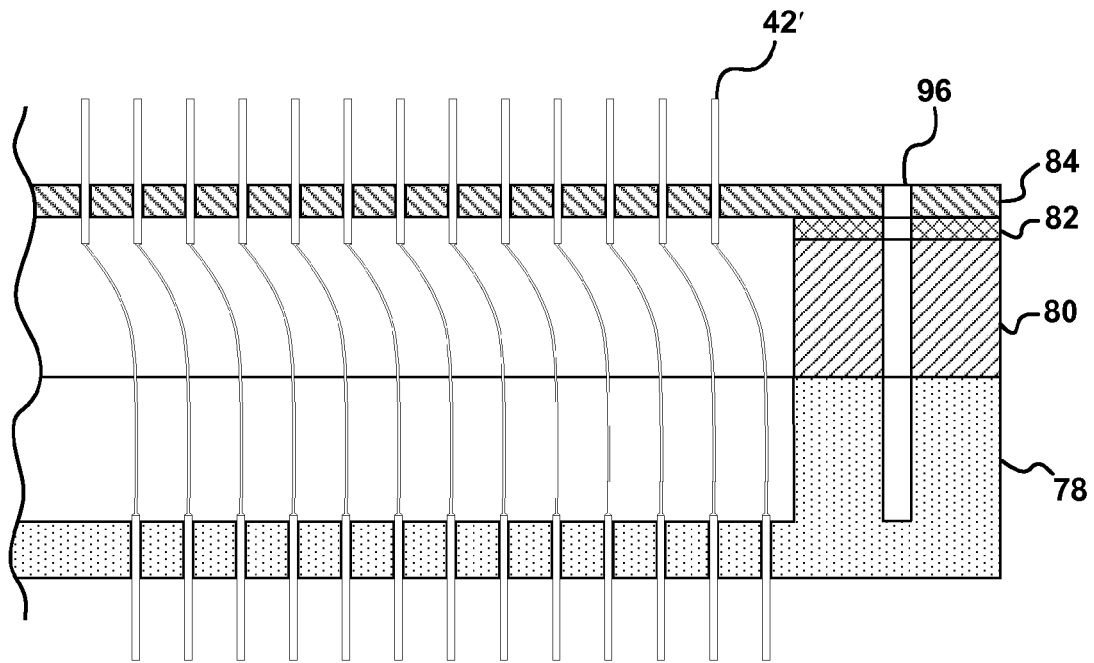
FIG. 9 is a cross-section of a die head according to some embodiments of the disclosed subject matter.
Figure 10:
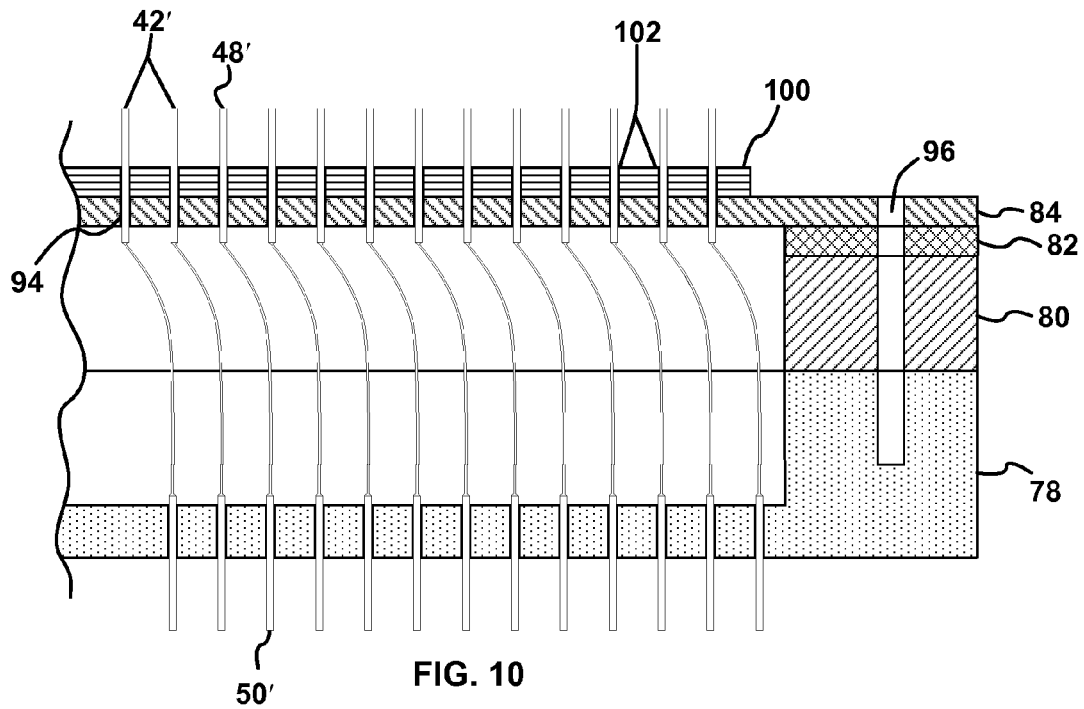
FIG. 10 is a cross-section of a die head according to some embodiments of the disclosed subject matter.

Referring now to FIG. 10, some embodiments are the same as those illustrated in FIG. 9, but include a second assembly aid film 100 positioned proximal to assembly aid film 84 and having an array of micro-holes 102 adapted to receive swaged probe pins 42'. Second assembly aid film 100 generally is in contact or close proximity to assembly aid film 84. Array of micro-holes 102 in second assembly aid film 100 and array of slotted holes 94 in assembly aid film 84 are adapted to be offset from array of micro-holes 76 formed in lower die portion 78 of the die head. The amount of offset is determined by the offset of each of swaged probe pins 42', i.e., the lateral distance between ends 48' and 50'.

Figure 11:
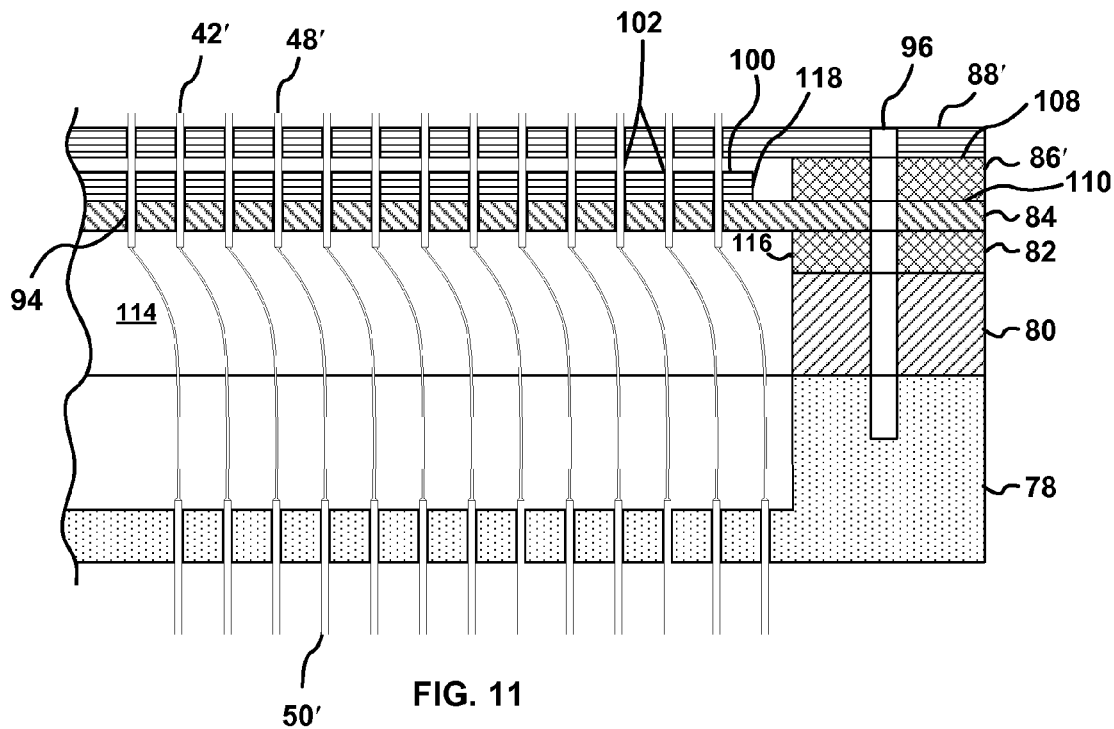
FIG. 11 is a cross-section of a die head according to some embodiments of the disclosed subject matter.

Referring now to FIG. 11, some embodiments are substantially similar to those in FIG. 10, but further include a second support frame 86' and a sheet 88'. Second support frame 86' includes a top surface 108 and a bottom surface 110. Sheet 88' is positioned on top surface 108 and bottom surface 110 is positioned on top of assembly aid film 84 so that second assembly aid film 100 is positioned between assembly aid film 84 and sheet 88'. In some embodiments, assembly aid 84 and second assembly aid film 100 are at least semi-transparent. Assembly aid films 84 and 100 may be any suitable polymer film, e.g., of the type formed from a polyimide. Assembly aid film 84 typically has a thickness of about 0.5 to 4 mils. In some embodiments, assembly aid film 84 has a thickness of 2 mils. Assembly aid film 100 typically has a thickness of 1 to 3 mills. In some embodiments, assembly aid film 100 has a thickness of 1 mil. Sheets 88 and 88' are typically substantially not transparent. Assembly aid film 84 generally creates a taut "drum skin" across an aperture 114 that includes a perimeter 116, which is defined within the die head and first support frame 82, thereby eliminating the non-flatness problem inherent in conventional designs. Second assembly aid film 100 is generally smaller in diameter than assembly aid film 84 and has an outer perimeter 118 that is smaller than perimeter 116 of aperture 114. As a result, second assembly aid film 100 is typically not connected with first support frame 82 and instead may float on top of assembly aid film 84.

Figure 12A:
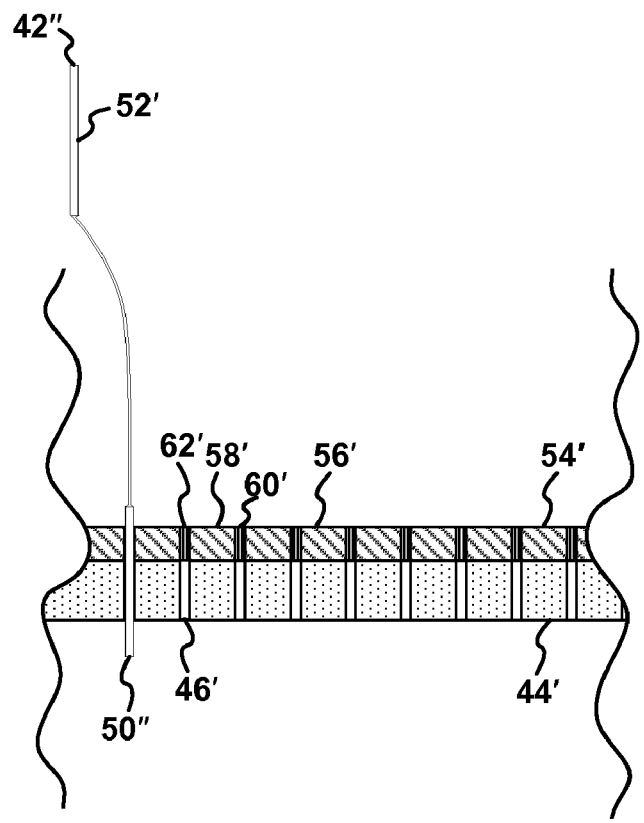
FIGS. 12A and 12B are cross-sections of an assembly aid film and die head according to some embodiments of the disclosed subject matter.
Figure 12B:
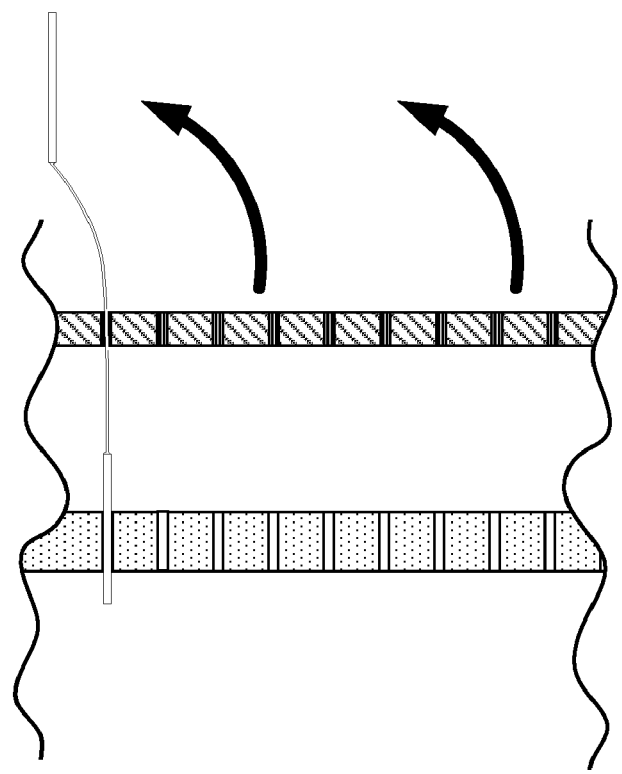

Referring now to FIGS. 12A and 12B, some embodiments include a method of aligning swaged probe pins 42" in an array of micro-holes 46' formed in a lower die portion 44' a die head assembly. As shown in FIG. 12A, in a first position, an assembly aid sheet 54' having slotted holes 56' is stacked on top of lower die portion 44'. Round portions 58' of slotted holes 56' are axially aligned with each of array of micro-holes 46'. Swaged probe pins 42", which each include cylindrical end portions 48", 50" and a swaged center portion 52", are inserted through slotted holes 56' in assembly aid film 54' and array of micro-holes 46' in lower die portion 44'. As shown in FIG. 12B, assembly aid film 54' is moved to a second position by lifting it upwardly over one cylindrical end portion 50" and over swaged center portion 52" of each of swaged probe pins 42". In doing so, each one of round portions 58' of slotted holes 56' is lifted over one of cylindrical end portions 48", 50" and each one of a slot portion 60', 62' of the slotted holes is lifted over one swaged center portion 52". In the second position, each of slotted holes 56' are offset from each of array of micro-holes 46' of lower die portion 44'. Although not shown, spacer portions and support frames can be configured and can be removed and inserted as required.

The disclosed subject matter offers a plurality of benefits and advantages over prior art designs. For example, the disclosed subject matter design enhances the repair-ability of the die head. Repairs can be performed by simply removing the second assembly aid film and/or polyimide sheet, withdrawing a damaged probe pin through the slotted holes in the assembly aid film, re-inserting a new probe pin, and re-installing the second assembly aid film. There is no need to remove the upper die, no possibility for the assembly aid film to lift off the probe heads, and no tearing of the film.

The assembly process of the disclosed subject matter described above offers several benefits over prior art assembly processes. First, it generally can be completed in less time than for conventional assembly. Next, because there is no longer any need to tie down the assembly aid film, there is no possibility for the film to lift off the probe heads. Also, it greatly reduces the likelihood of bending the probe pins, since the probe heads no longer have to be bent down and inserted upwards through the assembly aid film.

As described above for some embodiments of the disclosed subject matter, after all of the probe pins have been loaded, the second assembly aid film having an array of smaller diameter micro-holes is aligned over the probe heads and lowered onto the surface of the assembly aid film. The smaller micro-holes allow the probe pins to be held in close relative alignment to each other. In addition, since the second assembly aid film is generally not fixed to the die assembly, it allows free motion of the probe pins during probe pin compression while still maintaining their relative positions. The alignment of the second assembly aid film to the probe pins is much simpler than the upper die alignment of a conventional design because a) the second assembly aid film is preferably at least semi-transparent so the probe pins are always visible and b) it is not necessary that all the probe pins pass through all the micro-holes of the array simultaneously, but rather the second assembly aid film can be applied to sections of the array in stages.

A further advantage of the second assembly array film is evident in the lapping process. As described earlier, the lapping process generates debris. Since the second assembly aid film has a small diameter, i.e., "tight," micro-holes, the lapping debris collects on the top of this film, rather than passing into the head assembly. As the debris is on the outside of the assembly, it may be removed easily without requiring removal of the upper die. The second assembly aid film may even be removed entirely and replaced with a clean film.

The drilling process of the disclosed subject matter also offers improvements over prior art processes. The drilling of conventional upper dies is time consuming because the drilling process requires controlled feed rates and multiple passes in order to achieve good quality micro-holes and avoid drill breakage. In contrast, the assembly aid films according to the disclosed subject matter can be punched or laser drilled at low cost and low lead time. Also, the films of the disclosed subject matter offer opportunities for slotted holes, which provide advantages in very tight pitch applications, whereas conventional drilling processes are typically limited to round holes.

Although the invention has been described and illustrated with respect to exemplary embodiments thereof, it should be understood by those skilled in the art that the foregoing and various other changes, omissions and additions may be made therein and thereto, without parting from the spirit and scope of the disclosed subject matter.

What is claimed is:

1. A method of aligning swaged probe pins in an array of micro-holes formed in a lower die portion of a die head assembly, said method comprising:
    stacking an assembly aid film having slotted holes in a first position on top of said lower die portion so that round portions of said slotted holes are axially aligned with said array of micro-holes;
    inserting swaged probe pins having cylindrical end portions and a swaged center portion through said slotted holes in said assembly aid film and said array of micro-holes in said lower die portion; and
    lifting said assembly aid film to a second position by lifting it upwardly over said cylindrical end portion closest to said lower die portion and over said swaged center portion of each of said swaged probe pins; and
    wherein in said second position, each of said slotted holes are offset from each of said array of micro-holes in said lower die portion.

2. A method according to claim 1, further comprising:
    stacking a second assembly aid film including an array of micro-holes on top of said swaged probe pins so that cylindrical end portions of said swaged probe pins opposite said lower die portion extend through said array of micro-holes in said second assembly aid film.

3. A method according to claim 2, wherein each of said array of micro-holes of said second assembly aid film has a diameter that is selected so that each of said micro-holes in said lower die portion is substantially sealed when said swaged probe pins are inserted.

4. A method according to claim 1, wherein at least one of said assembly aid film and said second assembly aid film is at least semi-transparent.

* * * * *